United States Patent
Van Canpenhout

(10) Patent No.: US 8,458,630 B1
(45) Date of Patent: Jun. 4, 2013

(54) SUPPORTING DYNAMIC ASPECTS OF POLYMORPHISM IN HIGH-LEVEL SYNTHESIS OF INTEGRATED CIRCUIT DESIGNS

(75) Inventor: David Van Canpenhout, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 299 days.

(21) Appl. No.: 12/824,152

(22) Filed: Jun. 26, 2010

(51) Int. Cl.
*G06F 17/50* (2006.01)

(52) U.S. Cl.
USPC .......................................... 716/104; 716/103

(58) Field of Classification Search
None
See application file for complete search history.

(56) References Cited

U.S. PATENT DOCUMENTS

| | | | |
|---|---|---|---|
| 6,467,075 B1 * | 10/2002 | Sato et al. | 716/103 |
| 6,701,501 B2 * | 3/2004 | Waters et al. | 716/103 |
| 6,964,029 B2 * | 11/2005 | Poznanovic et al. | 716/105 |
| 7,376,939 B1 * | 5/2008 | Nayak et al. | 717/144 |
| 7,383,529 B2 * | 6/2008 | Gupta et al. | 716/104 |
| 7,472,361 B2 | 12/2008 | Watanabe et al. | |
| 7,523,423 B1 * | 4/2009 | Koelbl et al. | 716/103 |
| 7,565,631 B1 * | 7/2009 | Banerjee et al. | 716/103 |
| 7,587,687 B2 | 9/2009 | Watanabe et al. | |

OTHER PUBLICATIONS

Bruschi et al., "A Design Methodology for Exploitation of High Level Communication Synthesis," Proc. of the Design, Automation and Test in Europe Conference and Exhibition Designers' Forum, 2004 IEEE, 6 pages.*
Grimpe et al., "Object-Oriented High Level Synthesis Based on SystemC," 2001 IEEE, pp. 529-534.*
Grimpe et al., "Extending the SystemC Synthesis Subset by Object-Oriented Features," Codes+ISSS'03, 2003 ACM, pp. 25-30.*
Pomante, "Exploiting Polymorphism in HW Design: a Case Study in the ATM Domain," Codes+ISSS'04, 2004 ACM, pp. 81-85.*
CodeSourcery,Compaq,EDG,HP,IBM,Intel,Red Hat, and SGI; Itanium C++ Application Binary Interface (ABI), Revision 1.86; 2005; 46 pages.
Synthesis Working Group of Open SystemC Initiative; "SystemC Synthesizable Subset' 1.3 draft"; Jun. 2009; 94 pages.
Lippman, S.; "Inside the C++ Object Model"; 1996; pp. 69-72, 82-101, 113-139.
Lavagno, Luciano; Kondratyev, Alex; Watanabe, Yosinori; Zhu, Qiang; Fujii, Mototsugu; Tatesawa, Mitsuru; and Nakayama, Noriyasu; "Incremental High-Level Synthesis"; Design Automation Conference, 2010 15th Asia and South Pacific; Jan. 2010; pp. 701-706.

* cited by examiner

*Primary Examiner* — Leigh Garbowski
(74) *Attorney, Agent, or Firm* — Alford Law Group, Inc.

(57) ABSTRACT

A method for integrated circuit design is disclosed including determining if at least one dynamic class and at least one virtual function are present within a chip program description of an integrated circuit design; and if so then converting the at least one virtual function into a non-virtual function, generating at least one virtual pointer for the at least one dynamic class, converting at least one function calling the at least one virtual function into at least one conditional function responsive to a value of the at least one virtual pointer, and generating dataflow graphs of the at least one dynamic class and the at least one conditional function that can be transformed into a synthesizable design description of the integrated circuit design.

21 Claims, 17 Drawing Sheets

(BACKGROUND)

(BACKGROUND)

```
//ORIGINAL CODE CONTAINING VIRTUAL FUNCTIONS

//This is the Date1 class. It represents a date
//with only year-precision.
struct Date1{
                Date1 (int year)
                   : m_year(year)    {}      } 602
    int         getYear()    const   {return m_year;} 603
    virtual short  getDay()     const   {return 1;} 604A
    virtual short  getSecond()  const   {return 0;} 604B
    int         m_year;
};
//This is the Date2 class. It represents a date
//with year+day precision.
struct Date2: Date1{ 606
                Date2(int year, short day)
                   : Date1(year),                    } 607
                     m_day (day)                {}
    virtual short  getDay() const    {return m_day;} 608
    short       m_day;
};
//This is the Date3 class. It reprsents a date
//with year+day+second precision.
struct Date3: Date2 { 610
                Date3(int year, short day, short second)
                   : Date2(year, day),               } 612
                     m_second (second){}
    virtual short  getSecond() const  {return m_second;} 613
    short       m_second;
};
int
foo(Date1 *a) 614
{
    int y = a->getYear(); 623
    int d = a->getDay(); 624
    int s = a->getSecond(); 626
    return (3600 * (365 * y + d) + s); 628
}
```

FIG. 6

```
//LOWERED CODE NOT CONTAINING VIRTUAL FUNCTIONS                    700
//This is the Date1 class. It represents a date
//with only year-precision.
struct Date1{
                    Date1 (int y)         702A
                    : _vptr(1)
                    m_year(y) {}
    int        getYear()    const    {return m_year;}
    short      getDay()     const    {return 1;}            704A
    short      getSecond()  const    {return 0;}
    int        _vptr;                                       704B
    int        m_year;
};
//This is the Date2 class. It represents a date
//with year+day precision.
struct Date2: Date 1 {
                    Date2(int y, short d)
                    : Date1(y),          702B
                    _vptr(2)
                    m_day(d)              {}
    short      getDay()     const    {return m_day;}
    short      m_day;
};                                                          704C
//This is the Date3 class. It represents a date
//with year+day+second precision.
struct Date3: Date2 {
                    Date3(int y, short d, short s)
                    : Date2(y, d),       702C
                    _vptr(3),                               710
                    m_second (second){}
    short      getSecond()  const    {return m_second;}
    short      m_second;
};                                                          704D
int          714
foo(Date1 *a)
{              623
    int y = a->getYear();
//  int d = a->getDay();
    int d = (a->_vptr == 1 ? a ->Date 1::getDay()
                    : a -> Date 2::getDay());     } 724
//  int s = a->getSecond();
    int s = (a->_vptr == 1 ? a ->Date 1::getSecond()
        : a -> _vptr==2 ? a->Date1::getSecond()   } 726      FIG. 7
                    : a ->Date3::getSecond() );
    return (3600 * (365 * y + d) + s);
}                                              628
```

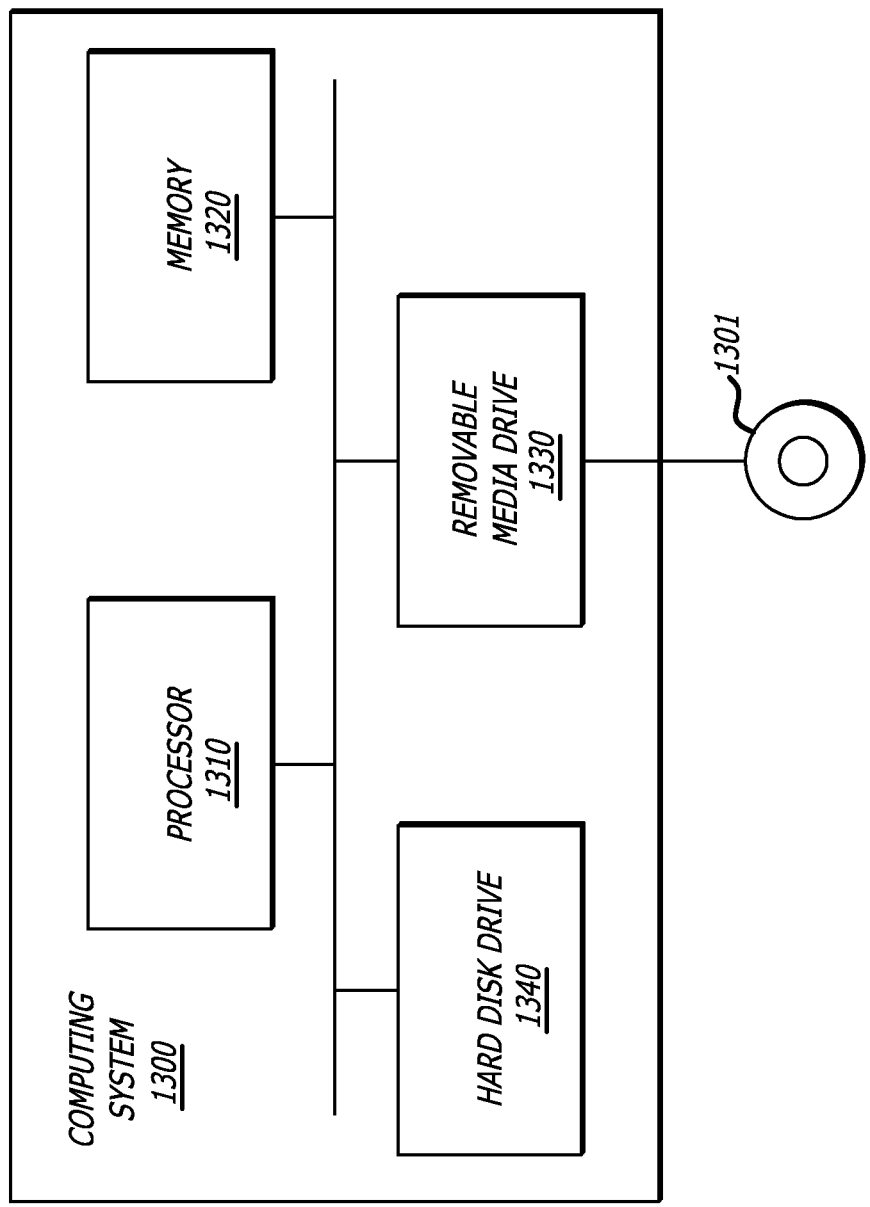

SUPPORTING DYNAMIC ASPECTS OF POLYMORPHISM IN HIGH-LEVEL SYNTHESIS OF INTEGRATED CIRCUIT DESIGNS

FIELD OF THE INVENTION

Aspects of the invention relate generally to high-level synthesis of integrated circuit (IC) designs.

BACKGROUND

The design of integrated circuit chips continues to evolve from the original concept of having more than one function on a chip to a complete system of components on a chip. Fabrication technology continues to rapidly decrease the design features size and increase the manufacturability size of a chip. This enables a large number of functions available to a designer to incorporate on a chip. Designers then, have the ability to create systems on an IC that are increasingly more complex and require a high-level design language in order to build, verify and test integrated circuit systems.

High-level description languages have become de rigor in complex chip design due to the inclusion of software design requirements as well as the ability to create systems on a single chip. A system may include a multitude of functions for example, a microprocessor may be considered a system as it includes functions such as a multiplier, a memory and input out as well as software, which coordinates and controls integrated operations performed by the functions and referred to as the micro-code. Functions may be contained in software design libraries that high-level designers may access in creating a system level design. High-level design is a level of abstraction with little or no low level information in order to facilitate faster design cycle time. Through the use of abstraction, a high-level design enables a proof of concept and ability to test and verify the system before fabrication and physical properties are considered. Thus enabling a decreased design cycle time.

Once the high-level system design has been proven, the lower level implementation details may then be addressed. Low-level constraints such as power and circuit timing may instill limitations that may prevent manufacturability. This may result in a high-level change in order to meet overall system level constraints. Making changes at the high-level does require a re-spin on the system design, testing and verification that increase design cycle time. Therefore enabling low level attributes to be analyzed, even if they are approximated, are generally desirable in the high-level design phase.

System level design has been increasing in complexity and designers are continuing to look for tools that enables them to not only design, test and verify a design yet be able to reduce the design cycle time. The system level designer typically has been trained to use software programming languages that enable reduced design cycle time as well as improved accuracy. System level designers may use C++ as a software programming language to create a system that includes hardware and software.

While C++ is a tool for high-level system design, other tools that implement the low level design, such as logic synthesis, require proprietary chip programming descriptions. Thus two design representations; one for high level simulation and one for low-level implementation are required. This created the potential for problems with consistency between the two chip representations and made the design cycle very error-prone especially for engineering change notices (ECN).

A standard library of functions, SystemC, was created by the Institute of Electronics and Electrical Engineers (IEEE) to address this issue. The SystemC library contains classes and functions for modeling hardware blocks that can be executed in a high-level design simulation. Synthesis tools may utilize high-level design representations through the deployment of SystemC and be used for both: high-level design and low-level implementation.

As the complexity of designing integrated circuits continues to push the limits of the design software infrastructure, the high level description languages may need to change in order to minimize the limitations/burden to the designer. The embodiment of this invention expands the capability of the design tools for the designers of integrated circuits.

SUMMARY OF THE INVENTION

The embodiments of the invention are best summarized by the claims. However in brief, in the dataflow of an object of a dynamic class, an encoding of its type is included. When a virtual function is called on the object, we can decode the type of the object from the dataflow and call the appropriate function. The type encoding is stored in the virtual pointer field (vptr) of the object. The virtual pointer field vptr can be shared among sub-objects. The virtual pointer field vptr is set in the constructors of the dynamic class. The virtual pointer field vptr does not store an address but an encoding of the type of the object. A virtual function call is implemented by (1) determining the type of the object on which the virtual function is called, (2) conditionally calling each virtual function override on the object, and (3) enabling only one of the conditional calls depending on the decoded type. The encoded type information stored in the virtual pointer field need not uniquely distinguish the type from all other types. The encoded type information is sufficient so that all virtual function calls can be resolved at run-time. If a system does not require dynamic cast and run-time type identification, then it is sufficient, within a strongly connected component of dynamic classes in the inheritance graph of all types used by the design, that every dynamic class within the component has a unique code. For typical use cases, only a few bits suffice to encode type information in the virtual pointer field so that support of virtual functions adds only a modest amount of overhead.

BRIEF DESCRIPTION OF THE DRAWINGS

The present invention is illustrated by way of example, and not limitation, in the figures of the accompanying drawings in which like references indicate similar elements and in which:

FIG. 6 illustrates an example of software code containing virtual functions.

FIG. 7 illustrates the example of the software code in FIG. 6 with virtual functions removed.

FIG. 13 illustrates a computing system that may be used to perform some or all of the processes in accordance with several of the embodiments of the invention.

DETAILED DESCRIPTION

Figure 1A:
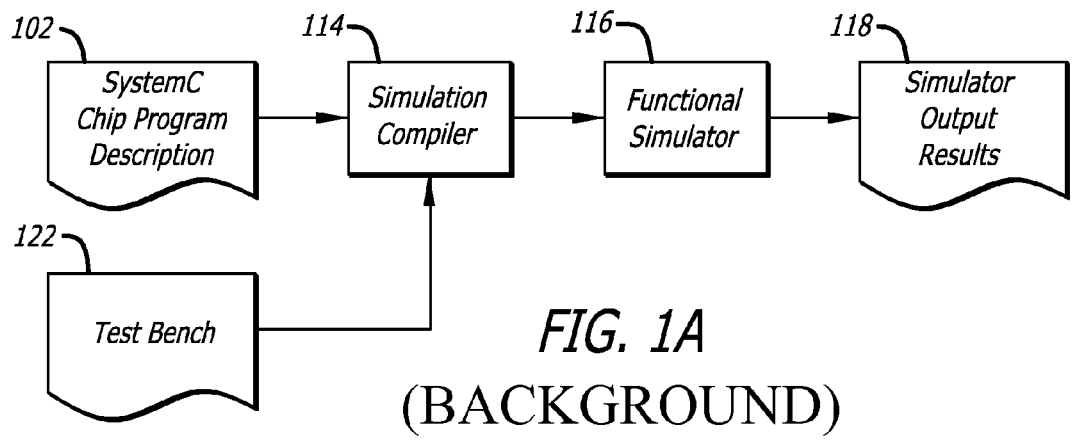
FIG. 1A is a block diagram of the SystemC high-level simulation flow.

In the following detailed description of the embodiments of the invention, numerous specific details are set forth in order to provide a thorough understanding of the aspects of the invention. However, it will be obvious to one skilled in the art that the embodiments of the invention may be practiced without these specific details. In other instances well known methods, procedures, components, and circuits have not been described in detail so as not to unnecessarily obscure aspects of the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

INTRODUCTION

The design of integrated chips (IC) has evolved into designing complete systems that can be optimized in terms of sharing components on-chip by different design functions. Functions may be created in hardware, software or a combination of hardware/software. Hardware functions may be created through the configuration of transistors on the silicon chip such as a logical NAND gate. Software functions may be created through a combination of software and hardware techniques. More complex software functions may coordinate/control several integrated hardware components and or functions to achieve a more complex function. An example of a complex function in an integrated circuit is one that facilitates handling packets of data through the use of the Asynchronous Transfer Mode techniques. The concept of handling the data packets with limited or no knowledge of the implementation details with a high level software description minimizes the complexity and enables the designer to focus on the high level aspects of the design.

The integration of multiple functions may result in fewer components and or transistors. Integration though, may increase the complexity of verifying and simulating a design. While the complexity continues to evolve, the chip design implementation techniques utilizing synthesis continues as a standard for creating physical layouts of the design functions. In order to work with increasingly complex systems, integrated circuit designers may require more sophisticated/automated design tools in creating systems. These are typically manifested in the form of Computer Aided Design (CAD) tools.

Design tools have become more software oriented to achieve design cycle time goals. Through abstraction and fewer low-level implementation details, designers have more capacity to handle the complexity of a large circuit design. The use of high-level abstraction software tools such as C++ may decrease the design cycle time. However, it may produce un-synthesizable chip program descriptions requiring additional designers/time to convert the un-synthesizable code into physical silicon.

Synthesis may be thought of as a translational process from a behavioral design description to a structural chip description. A behavioral design description includes a one-to-many mapping of a behavioral model onto a set of components that may be optimized for different constraints and or combinations of constraints such as power consumption, area, performance (delay), and cost. As with the high-level abstraction simulations, a plurality of alternative implementations may be evaluated throughout the design cycle. In each simulation though, a different set of constraints may be considered with unique optimization goals. This may lead to a construct in the high-level abstraction simulation that may be non synthesizable.

In FIG. 1A, the integrated chip has been represented in a software programming code that can more easily be used to designed with at a high level than at a low level. High-level design typically does not include low-level features such as timing, power, or component size. Through high level abstraction, a designer may decrease the design cycle time as the concerns of particular implementation features are not considered, thus enabling the designer to focus their efforts on the overall system functionality.

Referring to FIG. 1A, a SystemC chip program description 102 contains a representation of the integrated chip. The test bench 122 may contain the input stimulus and the expected resultant vectors as well as any configuration variables required to perform a simulation of the integrated chip. The test bench 122 information and the SystemC program description 102 are inputs to the simulation compiler 114.

The simulation compiler 114 reads in the information and creates a computer readable format that the integrated designer will use to simulate in the functional simulator 116. The functional simulation 116 does not include timing and verifies functions such as math functions (addition and multiplication), Boolean logic functions (AND, OR) and or compute functions such as reading memory locations.

Results of the functional simulator 116 are captured in the simulator output results 118. The simulator output results are analyzed and if need be, modifications made to the SystemC chip program description 102 and or test bench 122. Subsequent cycles of this flow will occur until the designer has achieved the intended design goal. It is not unusual for a designer of integrated circuits to run the simulator a plurality of times in order to achieve the desired results.

Figure 1B:
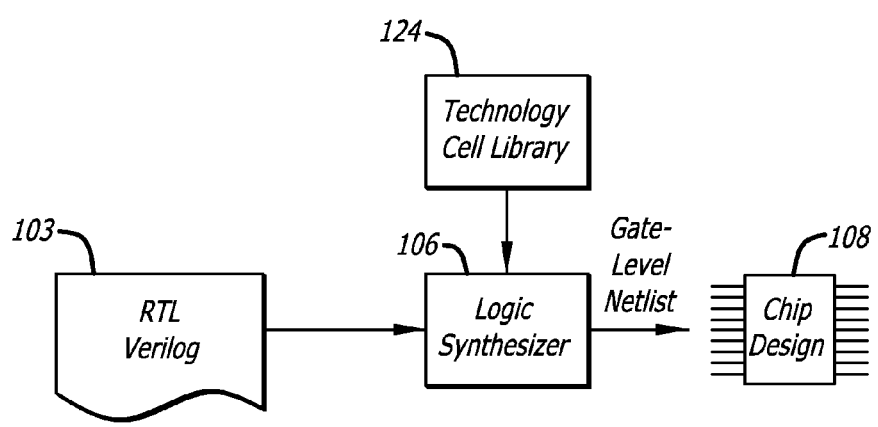
FIG. 1B is a block diagram of the traditional synthesis design flow used to create an integrated chip (IC).

The register transfer level (RTL) verilog 103 in FIG. 1B may be created concurrently with the SystemC chip program description 102 in order to reduce the design cycle time. Designers may try out several alternative implementations in order to achieve the design goals. Different constraints may be deployed such as optimize area or minimize delay in order to determine desirable results. Changes in the RTL verilog 103 require coherency with the high-level simulation chip description such as the SystemC chip program description 102. The resultant vectors of both simulations, RTL verilog 103 and SystemC chip program description 102, are desired to be identical i.e., they produce the same functionality.

Techniques deployed by those performing verification of the integrated chip (IC) will verify that the simulator output results 118 of the SystemC chip program description 102 and the RTL verilog 103 model are identical. The RTL Verilog 103 is a software programming code that is commonly referred to as register-transfer-level (RTL) language and is a method to describe the operation of a synchronous digital circuit.

The RTL verilog 103 in FIG. 1B then will be read by the logic synthesizer 106 design tool along with a technology cell library 124 that contains the timing characteristics for all the functions in a particular fabrication process. The output of the logic synthesizer 106 will be a gate level netlist that may then be used to create a timing-accurate chip design 108. The flows depicted in FIGS. 1A and 1B may be representative of a typical design flow used by integrated circuit designers.

The high potential for errors may exist with the design flows described by FIGS. 1A and 1B. One of the major issues is that there are two hand-created representations of the same circuit design. The potential for errors in concurrently developing two independent chip descriptions may lead to an integrated chip not achieving its intended goals. The joint development of the SystemC chip program description 102 and behavioral verilog 103 creates the potential for diverging results and or mistakes such as using the wrong version of the design description or failure to properly communicate changes between designers.

Additionally, design teams may not be collocated or even in the same part of the world. In order to reduce the design cycle time many companies deploy worldwide design teams on a single chip that further exasperates the potential for errors to occur. The cost to fix a design error rises exponentially the further in the design cycle they are found. If the design error is not discovered until the chip has been fabricated, it may result in a cancellation of the chip altogether as a potential market window has been missed. The importance of minimizing design errors is critical in terms of revenue and profitability for a company.

Figure 1C:
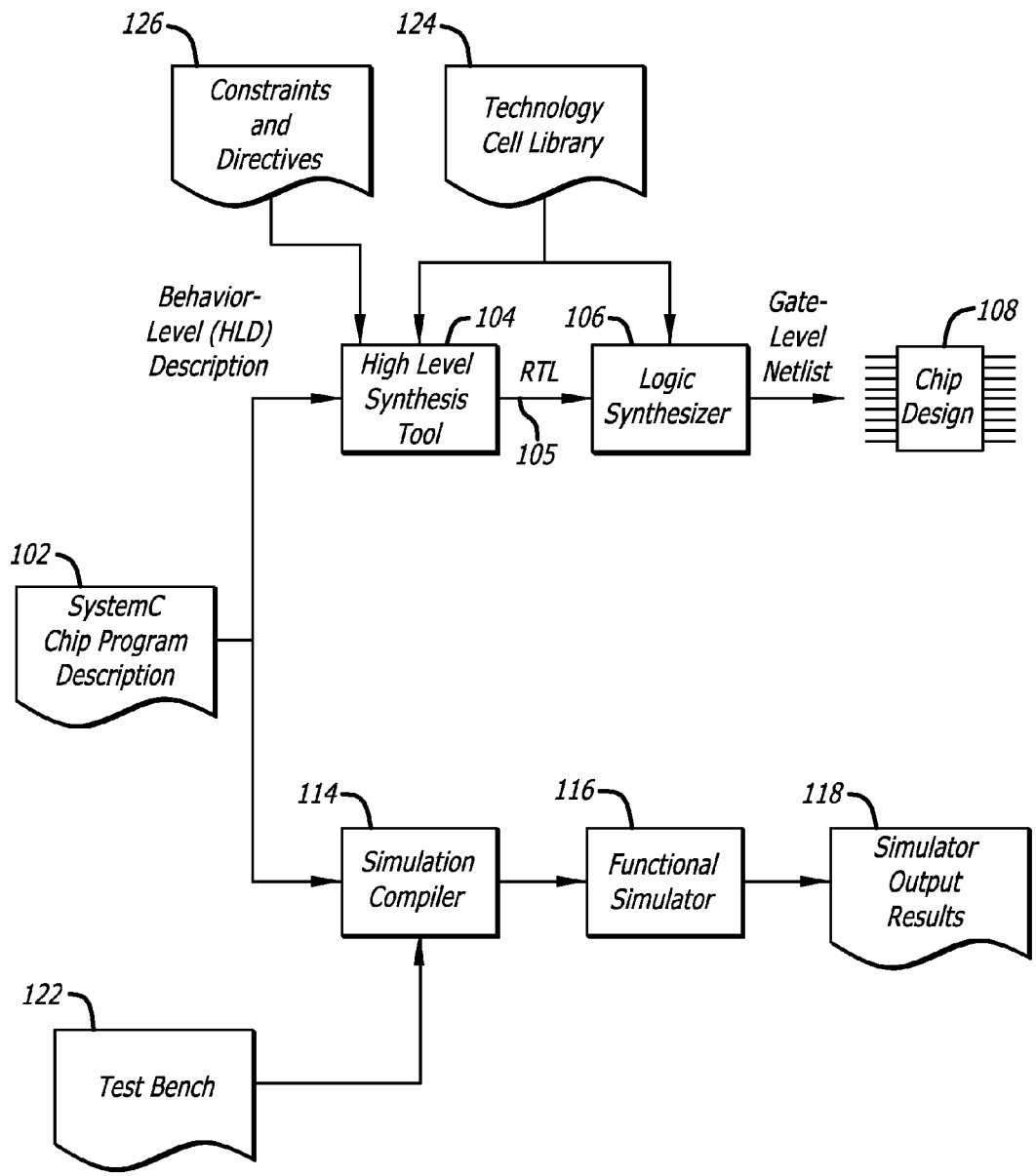
FIG. 1C is a block diagram of the combined low level synthesis flow with high level simulation design flow with a common SystemC chip program description or netlist.

In FIG. 1C, the SystemC chip program description 102 is used for both the high level simulation and to create the gate level netlist. This may reduce the errors as well as decrease the design cycle time, as only a single chip program description requires verification and testing. The simulation compiler 114 and the high level synthesis tool 104 shown in FIG. 1C take as an input, the SystemC chip program description 102. The high level synthesis tool 104 becomes the key differentiation component between FIGS. 1A/1B and FIG. 1C.

The SystemC chip program description 102, constraints and directives 126, and technology cell library 124 are inputs to the high level synthesis tool 104 shown in FIG. 1C. The high level synthesis tool 104 transforms the received inputs (including the System C chip program description written for C++ programming language) into a register transfer level (RTL) 105 chip description and is an input to the logic synthesizer 106. The logic synthesizer 106 takes the register transfer level (RTL) 105 input and the technology cell library 124 descriptions and creates a gate level netlist. This gate level netlist is a physical description of the SystemC chip program description 102 and is used in the silicon fabrication process to create the chip design 108.

FIG. 1C is a block diagram of a high-level design flow for an integrated circuit (IC) design. Transforming the SystemC chip program description 102 into RTL 105 is the key step in combining the block diagram flows of FIG. 1A and FIG. 1B. The high level synthesis tool 104 reduces work requirements on a design team in several ways. As an example, creating only one chip program description that can be used by both the logic synthesizer 106 and simulation compiler 114 reduces the number of chip program descriptions required as well as reduce additional verification steps.

Figure 2:
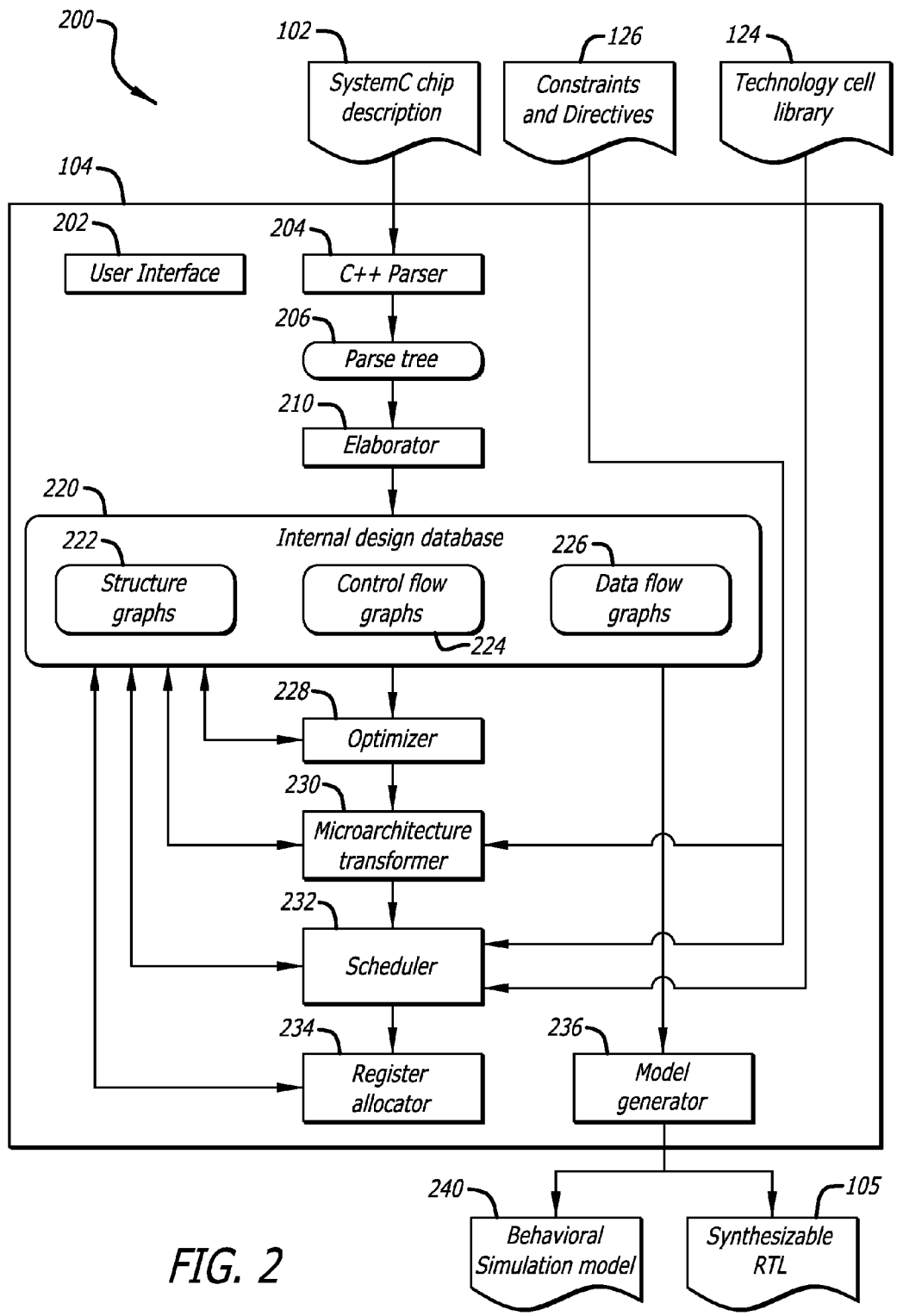
FIG. 2 is a block diagram of software modules and design flow of a high level synthesis tool.

Referring now to FIG. 2, a high level synthesis system 200 is shown. Software modules of the high level synthesis tool 104 are shown in communication with each other to perform processes to obtain synthesizable RTL of the SystemC chip description 102. As shown in FIG. 2, the inputs to high level synthesis tool 104 are the SystemC chip description 102, constraints and directives 126, and a technology cell library 124. These inputs and other commands are input through a user interface 202 that controls the functionality of the high level synthesis Tool 104. The high level synthesis tool 104 parses through the SystemC chip program description 102 with the C++ parser 204 and creates a parse tree 206. The C++ parser 204 analyzes the SystemC chip program description 102 and performs functions such as identify key constructs and relationships between functions. The output of this process is a parse tree 206 that is received by the elaborator 210.

The elaborator 210 then creates a new version of the SystemC chip description 102 such as the structure graphs 222, control flow graphs 224 and data flow graphs 226 that are typically created for a synchronous circuit design. The high level synthesis tool 104 then stores these graphs in an internal design database 220 to be operated on by other software modules and their functions such as the optimizer 228 and micro-architecture transformer 230.

The high level synthesis tool 104 further includes an optimizer 228, a micro-architecture transformer 230, a scheduler 232, a register allocator 234, and a model generator 236 in communication with the internal design database 220 and each other as shown in FIG. 2. The optimizer 228, a micro-architecture transformer 230, a scheduler 232, and register allocator 234 further generate and modify the graphs stored in the internal design database so that the SystemC chip description 102 can be synthesized. The model generator 236 receives the graphs of the internal design database 220 and generates the outputs of the high level synthesis tool 104, a behavioral simulation model 240 and/or a synthesizable RTL 105 of the desired chip design.

The behavioral simulation model 240 and synthesizable RTL 105, output from the high level synthesis tool 104, are the basis for subsequent timing simulation and physical layout generation. The logic synthesizer 106 uses the synthesizable RTL 105 to generate a gate level netlist. The gate level netlist is used by physical layout generation software to create the physical chip design 108 that is manufactured through a chip fabrication process.

Figure 3:
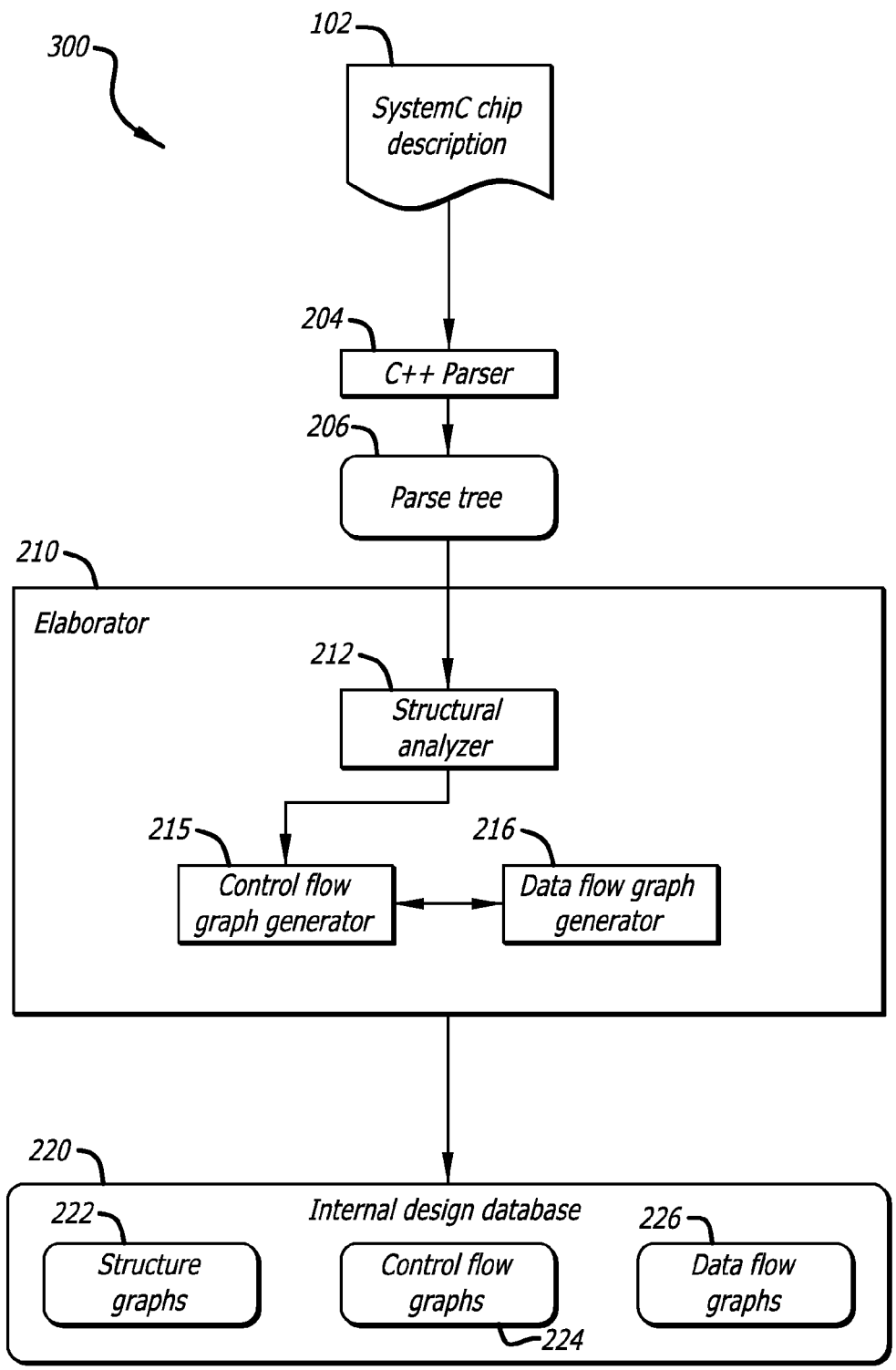
FIG. 3 is a block diagram illustrating the software modules and design flow of the elaborator function within the high level synthesis tool.

Referring now to FIG. 3, the software modules of the elaborator 210 in a design flow portion 300 are illustrated. The purpose of the elaborator 210 is to transform the high level SystemC chip program description 102 and break it down to a synchronous implementation form. The elaborator 210 is an intermediate step that creates outputs such as: structure flow graphs 222, control flow graphs 224, and data flow graphs 226 that can be more easily be optimized by subsequent processes. The elaborator 210 analyzes the SystemC chip programming description 102 from the parse tree 206 and determines how each construct should be processed.

The outputs of the elaborator 210 are: structure graphs 222, control flow graphs 224 and data flow graphs 226 that are stored in the internal design database 220.

FIG. 2 and FIG. 3 illustrate the process for implementing a design utilizing a SystemC chip program description 102 as an input in creating a chip design 108. Designers may utilize the C++ programming language to create a high-level chip program description. However, several of the C++ constructs that are available in the C++ programming language are not synthesizable and may require designers to perform non-automated steps to implement these functions/constructs into a chip design. The non-automated process may be known as a hand edit since it requires direct manipulation of the chip program description; a very time extensive task. One previously non-synthesizable function available in the C++ programming language is a virtual function.

While the concepts of virtual functions and dynamic classes is known to computer programmers that are familiar with C++ programming language, some C++ programming language terminology is now introduced to provide a foundation to further describe aspects of the invention.

Software programming implements a function that may be executed on a computer system 1300 such as shown in FIG. 13. A software program may accept data as an input and perform one or more operations on the data to produce an output.

Data, used in software programs, may be structured or unstructured. The software program would be designed in accordance to the expected data input. An example of unstructured data would be a group of sequential data. A data structure may consist of a group of data elements or members, consisting of different types and or lengths, grouped together with a unique identifier.

A class, in C++ programming language vernacular, expands the concept of a data structure in that functions and data may be contained to together in the data structure. This allows programmers the ability to separate program-specific data-types such as variables and constants through the use of classes. For example, there are many types of variables; each type may be considered as a class of elements or members. A C++ class may also be defined by the designer and or derived from another class.

Inheritance is the ability of a class to inherit or derive characteristics, capabilities or properties from another class. This is commonly referred to as polymorphism in object-oriented programming languages such as C++. Polymorphism or inheritance enables the integrated circuit designer to create new classes that override some or all of the characteristics, properties and or capabilities of another class. The class that is inheriting is called the 'derived class'; the class that is being derived from is called a 'base class' of the derived class. As previously taught, a class may contain member functions and data members, also called fields. A class may designate some of its member functions to be virtual member functions. When a class inherits from another class, the derived class inherits all of the member functions and data members of the base class. Furthermore, a derived class may override the definitions of any of the virtual function members of the base class thereby giving these functions new meaning within the context of the derived class.

A dynamic class may be defined as a class that (a) contains a virtual function, or (b) a class that is derived from a dynamic class, or (c) a class that has a virtual base class. Single inheritance indicates that a class can have at most, one base class. The embodiment of the invention involves converting virtual functions and dynamic classes into synthesizable functions i.e., functions that may be translated by the logic synthesizer 106 in FIG. 1C.

The addition of the virtual functions and dynamic class translations increases the number of synthesizable functions available to the high level designers. This may also decreases design cycle time, as designers no longer have to perform hand-edits and or perform additional verification steps, and reduce the potential for design errors. An understanding of the relationship between C++ and SystemC is required to better understand the invention.

The Institute of Electronics and Electrical Engineers (IEEE) created a standard C++ library for system and hardware design referred to as SystemC library. The SystemC library contains high-level design functions, some of which are synthesizable. Synthesizable functions are functions that can be interpreted by a synthesis tool and mapped into Boolean logic gates and functions that can be implemented into a physical layout of an integrated circuit chip. Through the deployment of SystemC, synthesis tools may then be able to utilize high-level design representations and eliminate the need to develop two chip descriptions: one for simulation/design and one for implementation. However, the increase in complexity in circuit design has led to integrated chip designers to use C++ instead of SystemC to ease the burden of chip design/simulation.

As the electronics industry builds more complex systems involving large numbers of components including software, there is an ever-increasing need for a modeling language that can manage the complexity and size of these systems. SystemC provides a mechanism for managing this complexity with its facility for modeling hardware and software together at multiple levels of abstraction. This capability may not be available in traditional high-level description languages. Previously, high-level description languages required learning a new software language, unique to the IC design industry. Designers have been taught C, C++ languages in their education making it easier to create a chip program description in C++ versus learning a new proprietary language.

Figure 4:
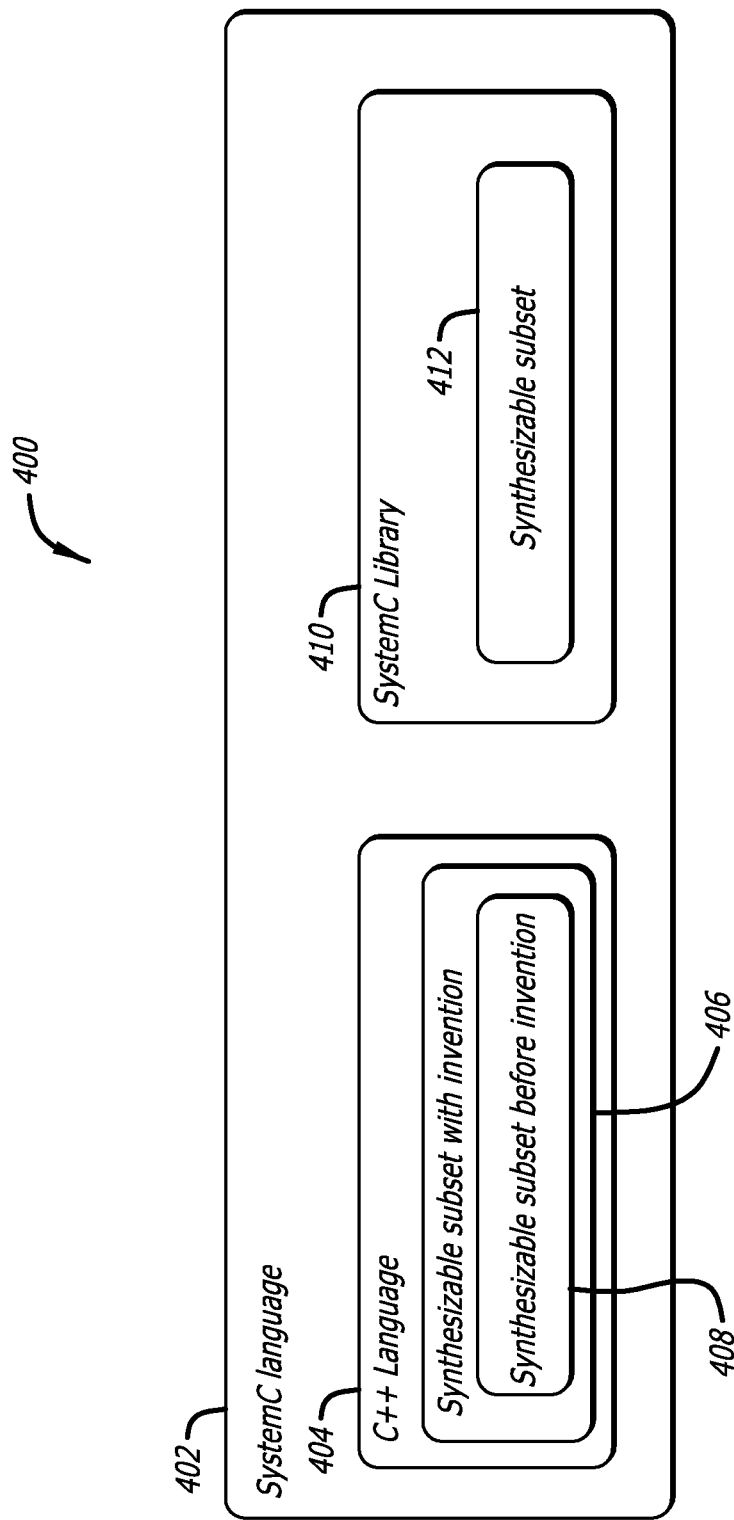
FIG. 4 illustrates a Venn diagram of the relationships within SystemC and C++.

FIG. 4 illustrates a Venn diagram mapping the relationship between SystemC and C++ programming languages. As previously stated, SystemC encompasses both a programming language (C++, ISO 14882) and a library (SystemC class library, IEEE1666). SystemC has been standardized such that computer aided design (CAD) tool developers may create software programming code that translates the language and library. This enables portability for designers such that any SystemC chip program description 102 may be translated in a similar fashion by every logic synthesizer tool created to use the SystemC standard.

In FIG. 4, the SystemC language 402 includes the C++ language 404 and SystemC library 410. The C++ language 404 contains synthesizable subset with invention 406 and synthesizable subset before invention 408. The invention increases the synthesizable subset through the addition of translating virtual functions and dynamic classes under the restrictions of single inheritance and no virtual inheritance. The SystemC library 410 contains a synthesizable subset 412.

The high level synthesis tool 104, a high-level synthesis tool providing electronic computer aid design (ECAD), has adopted SystemC as the chip program description language for designing integrated chips (IC). The high level synthesis tool 104 allows designers to synthesize high-quality register transfer level (RTL) implementations from untimed SystemC descriptions of the integrated circuit chip design. C++ is considered a high level general purpose programming language/library and is not specifically intended for logic synthesis. Logic synthesis tools have been designed to translate a number of synthesizable standard functions into Boolean logic functions of an integrated circuit design.

The synthesizable subset of standard functions enables designers to use a logic synthesizer 106 from an ECAD software vendor to translate RTL verilog 103 into a chip design 108. ECAD software vendors may impose language restrictions in order to ensure the behavioral verilog can be synthesized completely. This eliminates time intensive hand-edits thus decreasing the chip design cycle time. When the chip program description is newly created it is relatively easy to utilize the synthesizable subset of SystemC. However, many users often start with a legacy C++ chip program description and then modify it such that it may be used in the synthesis of an integrated circuit chip by a logic synthesizer tool. This may require significant manual edits to the legacy C++ chip program description in order to meet the language restrictions of the logic synthesizer tool.

The C++ language compilers support virtual functions by including in every object of a type that has a virtual function, a field referred to as virtual pointer (vptr) field. The vptr field of an object of a given dynamic class points to the virtual function table (vtable) of that dynamic class. The vtable of a given class contains the addresses of all the virtual functions of that class. A virtual function call is different from a normal function call in that the address of the function to be called is resolved at run-time. This is accomplished by (1) reading the vptr field of the object on which the virtual function is to be called, (2) adding a constant offset to the value obtained in (1), and (3) loading the content of the address obtained in (2); the result of (3) is the address of the function to be called. However this implementation of processing virtual functions is not appropriate for a high-level synthesis tool to synthesize an integrated circuit chip from a SystemC chip description because all functions (including virtual functions) are required to be static or resolved at run-time. The embodiments of the invention resolve the dynamic aspects of polymorphism, such as virtual functions and dynamic classes, so that a SystemC chip description is synthesizable.

A virtual function is a member function of a class that can be redefined (overridden) in classes derived from a given class. A virtual function may be overridden partially or completely and changes the behavior of the function within an inheriting class. Virtual functions and dynamic classes are not defined in SystemC, though commonly used in the high-level chip program description, C++ program language, to initially model the function of complex integrated circuits (IC).

When the virtual function is called on an object, the actual function that gets called depends on the type or class, of the object. In general, the full type or class of an object referenced by pointer or reference is not known at chip program description compile-time, but only at run-time. This is one dynamic (run-time) aspect of polymorphism.

The synthesizable subset for SystemC excludes these dynamic aspects of polymorphism, such as virtual functions. The synthesizable subset of SystemC requires that all virtual function calls be resolved statically at compile time. This requires that the complete type of every object on which a virtual function is called can be inferred at compile-time. In general it is not possible to determine the complete type of every object on which a virtual function is called and therefore it is not possible to resolve every virtual function call at compile time. Thus, the synthesizable subset of SystemC supports virtual functions only in restricted cases.

The embodiment of the invention addresses these limitations by providing a method that allows a high-level synthesis tool to handle dynamic aspects of polymorphism. This includes virtual function calls where the type of the object cannot be determined by means of static analysis. The embodiments of the invention extend the synthesizable subset of SystemC and thereby makes high-level synthesis applicable to a wider range of design descriptions.

Methods of Processing Virtual Functions and Dynamic Classes

Figure 5:
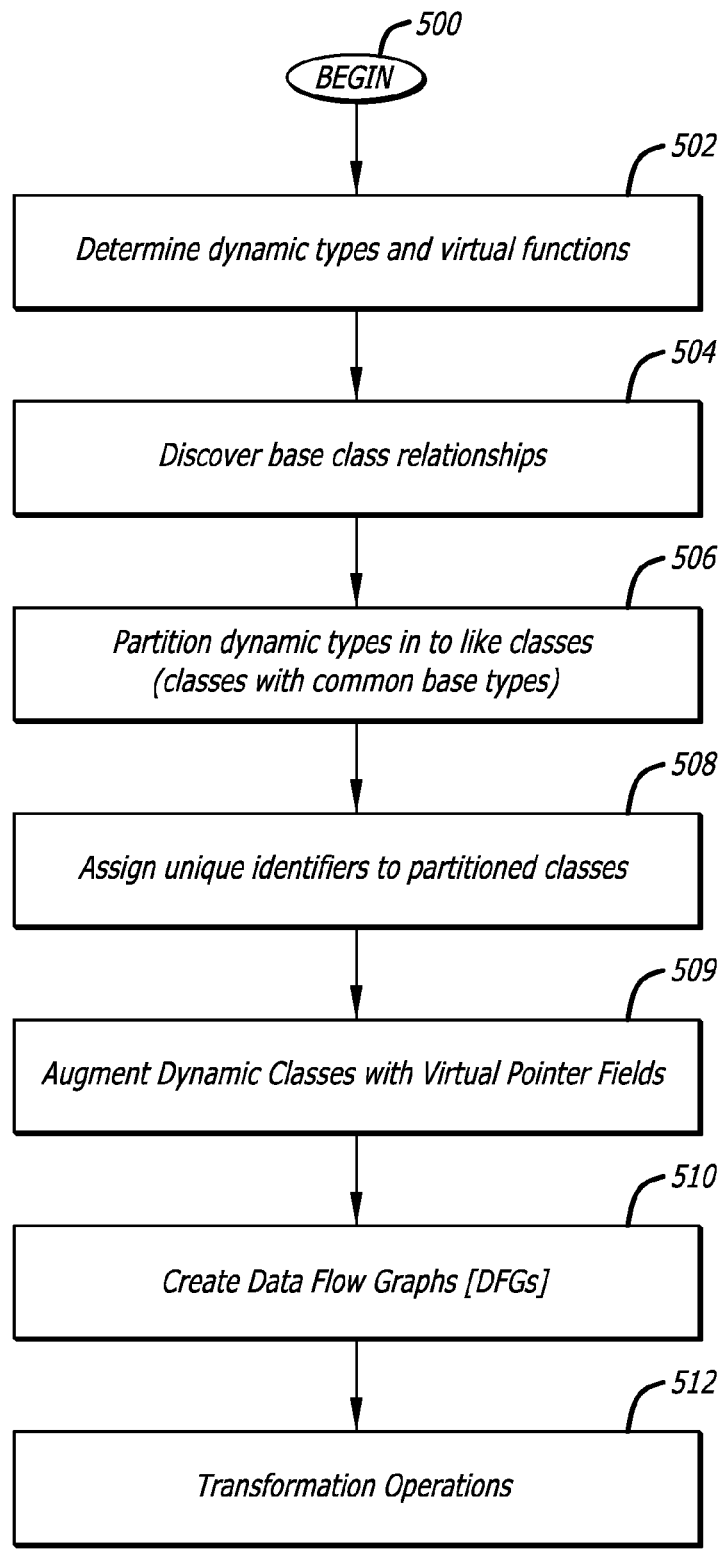
FIG. 5 illustrates the invention process flow to convert virtual functions and dynamic classes into synthesizable constructs.

In FIG. 5, a method of processing virtual functions and dynamic classes is illustrated. The elaborator 210 in FIG. 3 performs this function as part of the high level synthesis tool 104 shown in FIG. 2. The method begins with process block 500 and goes to process block 502.

At process block 502, the dynamic classes (types) and virtual functions are determined within the SystemC chip description 102. The C++ parser 204 parses the SystemC chip description 102 into a parse tree 206. The elaborator 210 analyzes the parse tree 206 and identifies the dynamic classes and the virtual functions therein. The process then goes to process 504.

At process block 504, the inheritance relationships are discovered. This involves identifying the base classes of a class as well as identifying which classes are dynamic because they contain a virtual function or because they derive from a dynamic class, i.e., because they have a dynamic base class. The process then goes to process block 506.

At process block 506, the dynamic classes are partitioned into like classes, classes having common base classes. This means that the set of dynamic classes are grouped into groups so that within a group, any two classes have a common base class. The process then goes to process block 508.

At process block 508, unique identifiers, type Ids (typeids), are assigned within each group of the partition. Consequently, any two related dynamic classes, dynamic classes that have a common base class, may have distinct identifiers. The result of the analysis or functions performed with process blocks 504, 506, 508, and 509 are used during the process of building the dataflow graphs in process block 510.

At process block 509, the virtual pointer field (vptr) is added to all dynamic classes so that the dataflow for the virtual pointer field can be elaborated. The virtual pointer field is not a pointer, but field or data member. The process then goes to process block 510.

At process block 510, data flow graphs are created for each function. If the function is a constructor of a dynamic class, this involves setting the vptr field of the object to the type identifier of the corresponding class. The dataflow graph fragment for a virtual function call is elaborated by (1) selecting the vptr field of the object on which the virtual function is called, (2) elaborating conditional function calls to the function defined in the base class and to all of the overrides of that function (The conditions are derived from comparing the vptr field against the typeids); and (3) Selecting the results of one of these function calls, again based on the value of the vptr field. The process then goes to process block 512.

At process block 512, the dataflow elaborated in process block 510 is then transformed to a lower level dataflow. Transformation involves eliminating variables from the dataflow. This transformation process is implemented for all functions (virtual and normal) and all classes including dynamic classes.

Referring now to FIG. 6, a simple example of lines of instruction of C++ code 600 including virtual functions and dynamic classes is shown and now described to gain a better understanding of aspects of the invention. The example shown in FIG. 6 illustrates conceptually how virtual functions may be removed and translated from a chip program description 102.

The exemplary C++ code 600 has three classes (class Date1, class Date2, and class Date3). Class Date1 represents a point in time (date) with only year precision. Class Date1 contains an integer field m_year to hold the value of the year. Class Date2 represents a date with additional information: the day within the year. Therefore, class Date2 derives from class Date1 and inherits the capability of representing a date with year precision. Class Date2 includes the field m_day of type short in order to represent the extra information of the day within a year.

Class Date3 represents a date with increased precision: seconds within a day. Therefore class Date3 derives from class Date2 with the addition of a field m_second to represent the seconds within a year.

Class Date1 has two virtual functions; a getDay( ) virtual function 604A and a getSecond( ) virtual function 604B with associated default return values of return 1 and return 0 respectively.

Class Date2 inherits the virtual functions getDay( ) 604A and getSecond( ) 604B from class Date1. However, it also provides a new definition for virtual function getDay( ) 604A as well as virtual function getDay( ) 608, thereby overriding the definition for virtual function getDay( ) 604A provided in class Date1.

When virtual function getDay( ) 608 is called on a Date2 object, it will return m_day, instead of returning the constant value 1.

Class Date3 inherits the virtual functions getDay( ) 608 and getSecond( ) 604B from its base class Date2. It overrides the definition of the getSecond( ) 604B virtual function with getSecond( ) virtual function 613 by providing a new definition. When the virtual function getSecond( ) is called on a Date3 object, the virtual function getSecond( ) 613 is called and not the getSecond( ) 604B virtual function. The getSecond( ) 613 virtual function returns m_second for a Date3 object. This is in contrast to the case where getSecond( ) is called on a Date1 or Date2 object. If a getSecond( ) virtual function is called on a Date1 or Date2 object, the function defined in class Date1 604B is called, which returns a value of 0.

The instructions of the exemplary C++ code 600 further has defines a function foo( ) 614. The function foo( ) 614 has a formal argument "a" that is a type pointer to the Date1 class. The function foo( ) 614 includes three function calls 623, 624, 626 including the type pointer "a". The function call 624, integer day (int d) function call, points with the pointer to the virtual function 604A with the type pointer "a". The function call 626, integer second (int s) function call, points with the pointer to the virtual function 604B with the type pointer "a". The function call 623, integer year (int y) function call, points with the pointer to the integer function 603 with the type pointer "a".

Assuming the code 600 was directed to a chip description, conceptually it is desirable to remove the virtual functions and dynamic classes from the original high-level code description of the chip by translating them and generate a lower level code description of the chip that can be synthesized.

Referring now to FIG. 7, continuing with the example code of FIG. 6, a lowered level of C++ instruction code 700 is illustrated. The instruction code 700 is the result of the process of converting the virtual functions and dynamic classes from the instruction code 600 in accordance with the process shown in FIG. 5.

Referring now to FIGS. 5-7, process 502 identifies and determines dynamic class types and virtual functions based upon the constructs defined by C++ standard in defining a virtual function. The virtual functions 604A and 604B can be identified by the word "virtual" in the instruction line of the code 600 in FIG. 6.

An inheritance graph is created in accordance with process 504 indicating the relationship between class Date1, class Date2, and class Date3, such as that between the structure of class Date3 610 and the class Date2 606.

In accordance with process 510, virtual functions 604A and 604B shown in FIG. 6, are converted into non-virtual functions 704A, 704B respectively as shown in FIG. 7. Virtual pointer (vptrs) fields 702A-702C are created and initialized. The constructor of the class Date1 initializes the first virtual pointer vptr(1) 702A to one. The constructor of the class Date2 initializes the second virtual pointer vptr(2) 702B to two. The constructor of the class Date3 initializes the third virtual pointer vptr(3) 702C to three.

Virtual function calls 624,626 in the function foo 614 are replaced with conditional non-virtual function calls 724, 726 respectively in the function foo 714. The non-virtual function calls 724,726 are conditional in response to the value of the virtual pointer vptr field of the object on which the virtual function is called.

For example, in the day function call 724, if the value of the vptr field is equal to one (vptr==1), then the pointer "a" points to an object of class Date1, and thus the non-virtual function call 704A, which returns 1, is active. Otherwise if the value of the vptr field is not equal to one, then the pointer "a" points to an object of the class Date2 or class Date3. In this case, a non-virtual function call to the non-virtual function getDay( ) 704C defined in class Date2 is active, this function returns the value of field m_day.

As another example, consider the result of eliminating the virtual function call 626. The virtual function call 626 is replaced by three conditional but non-virtual function calls 726. If the value of the vptr field on which the function is called is equal to one (vptr==1), the non-virtual function getSecond( ) 704B of class Date1 is active, which is appropriate because in this case, the pointer "a" points to an object of class Date1. If the value of the vptr field on which the function is called is equal to one (vptr==2), the non-virtual function getSecond( ) 704B of class Date1 is active, which is appropriate because in this case, the pointer "a" points to an object of class Date2 and class Date2 does not override getSecond( ).

Otherwise, if the value of the vptr field of the object on which the function is called is not one or two, the object pointed to by pointer "a" must be an object of type Date3. In this case the non-virtual function getSecond( ) 704D defined in Date3 is active.

Referring now to FIGS. 8-12B, data flow graphs are shown for a portion of the exemplary code depicted in FIG. 6 and FIG. 7 to further explain aspects of the invention. As discussed previously with reference to FIG. 5, the process of transforming virtual function calls and dynamic classes includes the creation of data flow graphs 226 in accordance with the lowered level of code description. The data flow graphs 226 are stored as part of the internal design database 220 of the high level synthesis tool 104 shown in FIG. 2.

Figure 8:
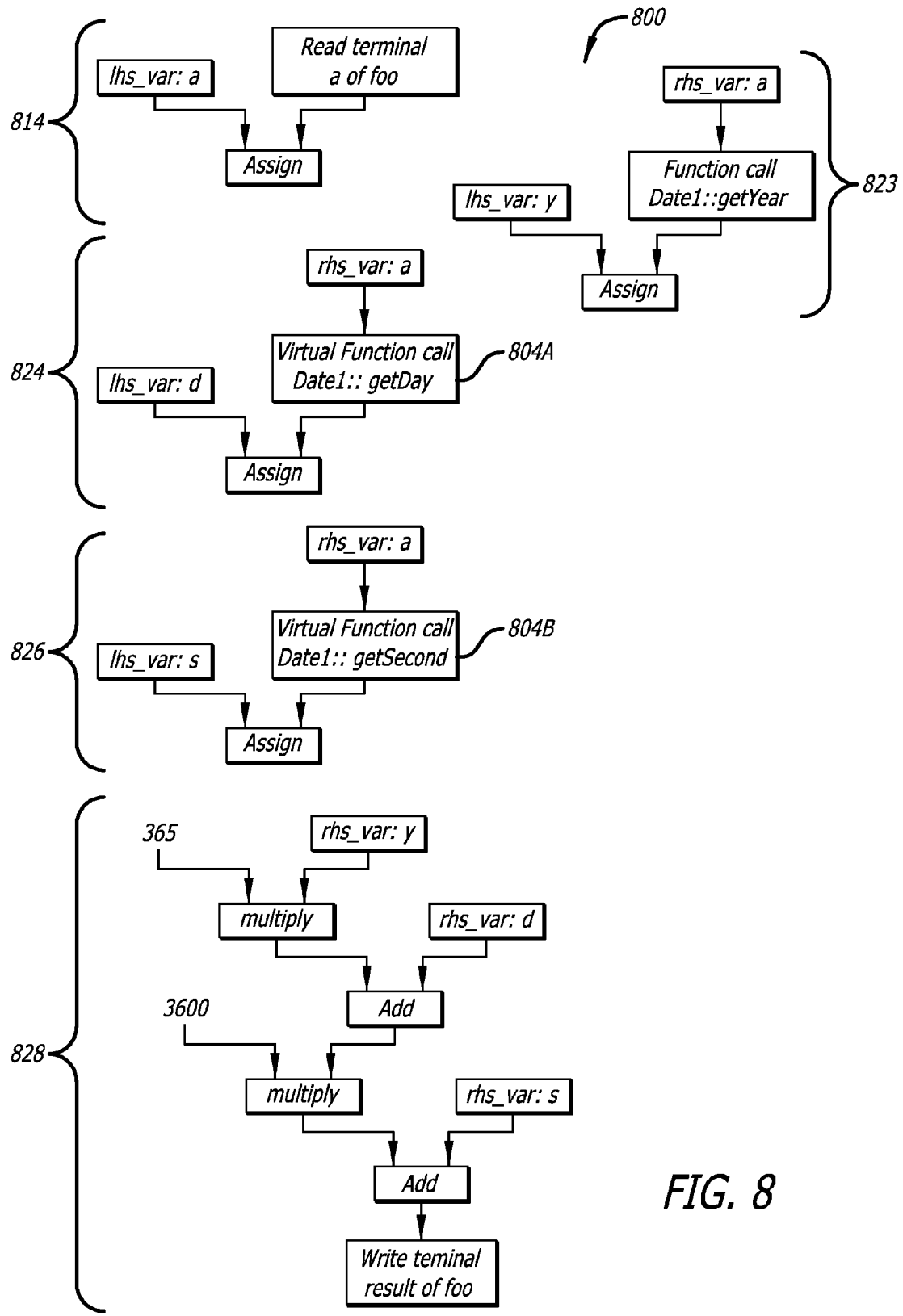
FIGS. 8, 9A-9B, 10A-10B, 11A-11B, and 12A-12B illustrate data flow graphs for the software code example of FIGS. 6-7.

FIG. 8 illustrates a data flow graph 800 for the software code example of the function foo( ) 614 shown in FIG. 6 without the process provided by the embodiment of the invention. Data flow graph portion 814 corresponds to instruction line 614 of the function foo. Data flow graph portion 823 corresponds to instruction line 623 and the integer function getYear 603. Data flow graph portion 824 corresponds to instruction line 624 and the virtual function getDay 604A. The data flow graph portion 824 includes block 804A with the virtual function call to getDay 604A. Data flow graph portion 826 corresponds to instruction line 626 and the virtual function getSecond 604B. The data flow graph portion 824 includes block 804B with the virtual function call to getSecond 604B. The blocks 804A-804B are the virtual functions getDay( ) and getSecond( ) respectively shown in data flow graph format. Data flow graph portion 828 corresponds to instruction line 628.

Figure 9A:
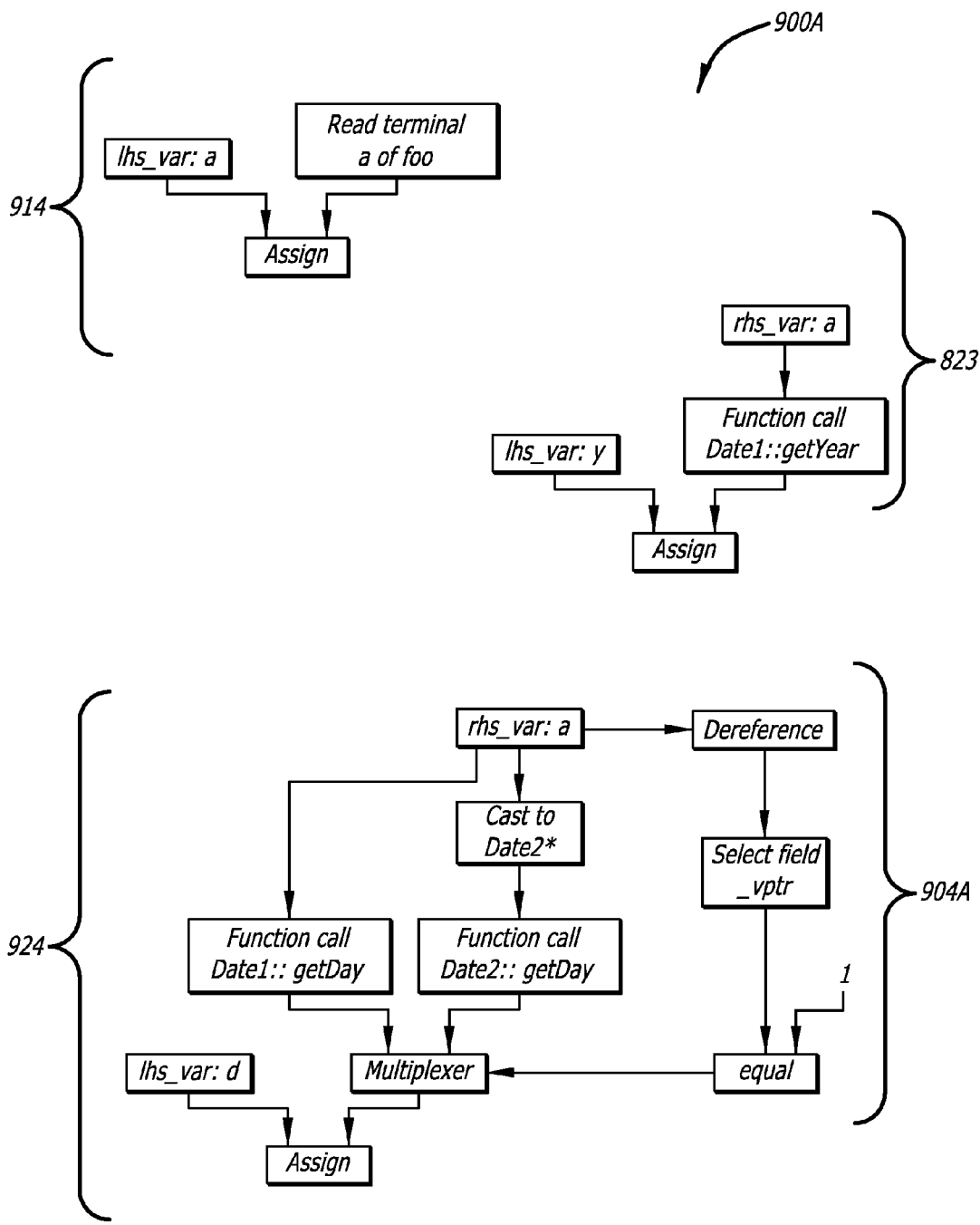
Figure 9B:
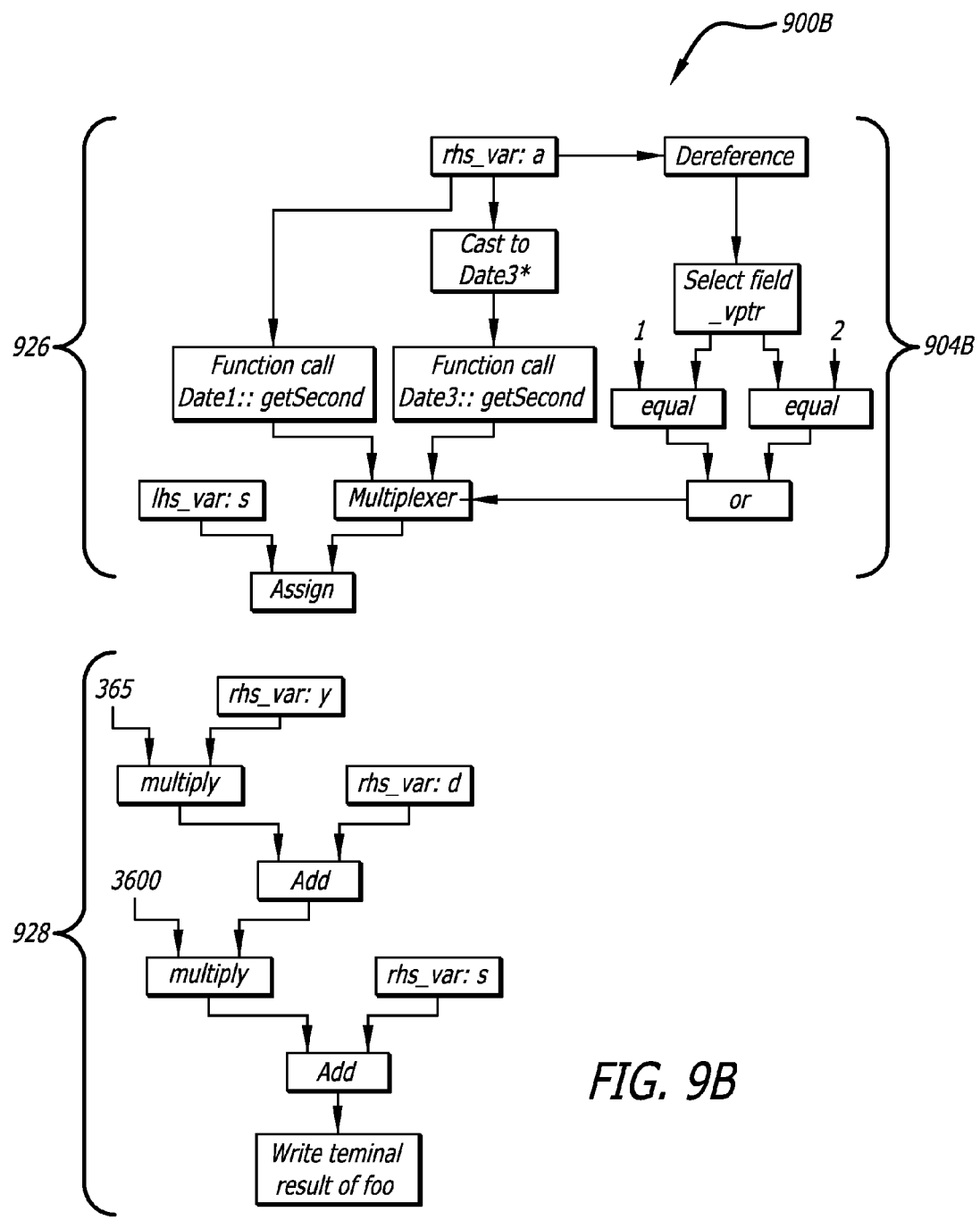

FIGS. 9A-9B illustrates data flow graphs 900A-900B for the software code example of the function foo( ) 714 shown in FIG. 7 with the process of the embodiment of the invention performed to generate the data flow graphs 900A-900B without virtual functions. The data flow graph 900A-900B includes data flow graph portions 823, 914, 924, 926, and 928.

The data flow graph portion 914 corresponds to instruction line 714 of the function foo. Data flow graph portion 823 corresponds to instruction line 623 and the integer function getYear 603. Data flow graph portion 924 corresponds to instruction line 724 and the conditional function call for get-Day 704A. The data flow graph portion 924 includes blocks 904A with the conditional function call.

In FIG. 9B, data flow graphs 900B with the data flow graph portion 926 corresponds to instruction line 726 and the conditional function call for getSecond 704B. The data flow graph portion 926 includes blocks 904B with the conditional function call to getSecond 704B. The data flow graph portion 928 corresponds to instruction line 628.

Figure 10A:
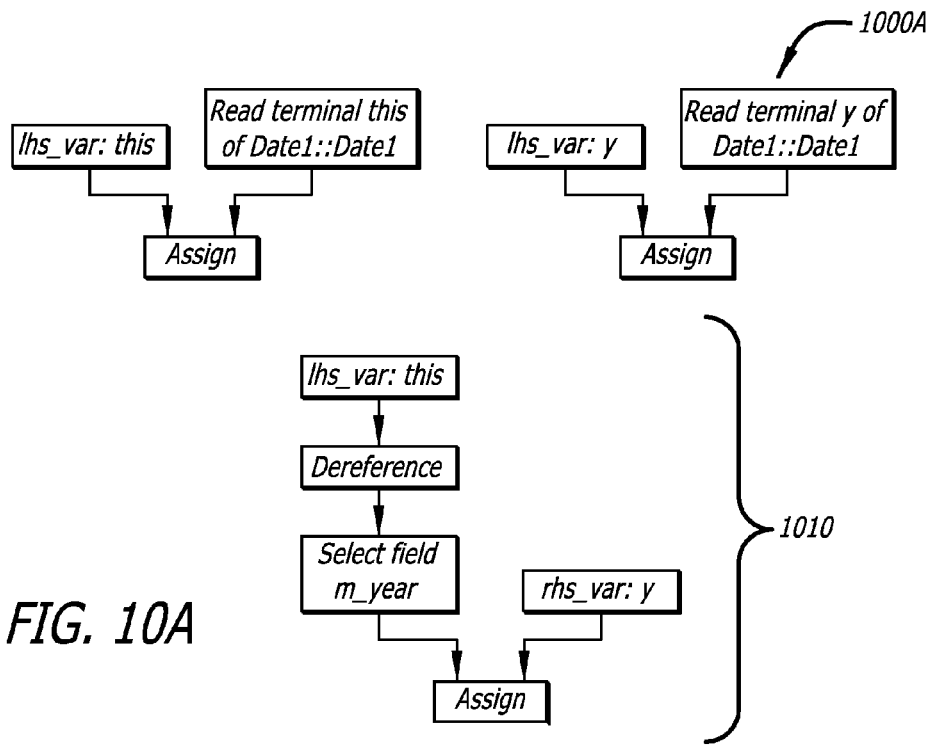
Figure 10B:
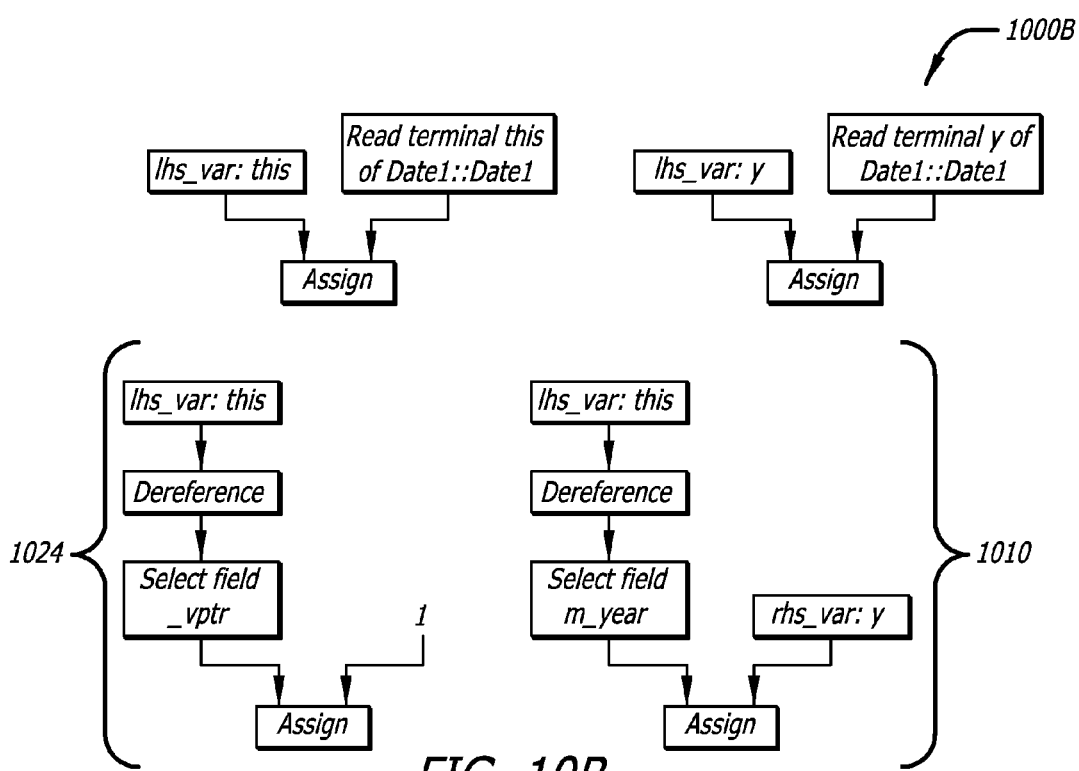
Figure 11A:
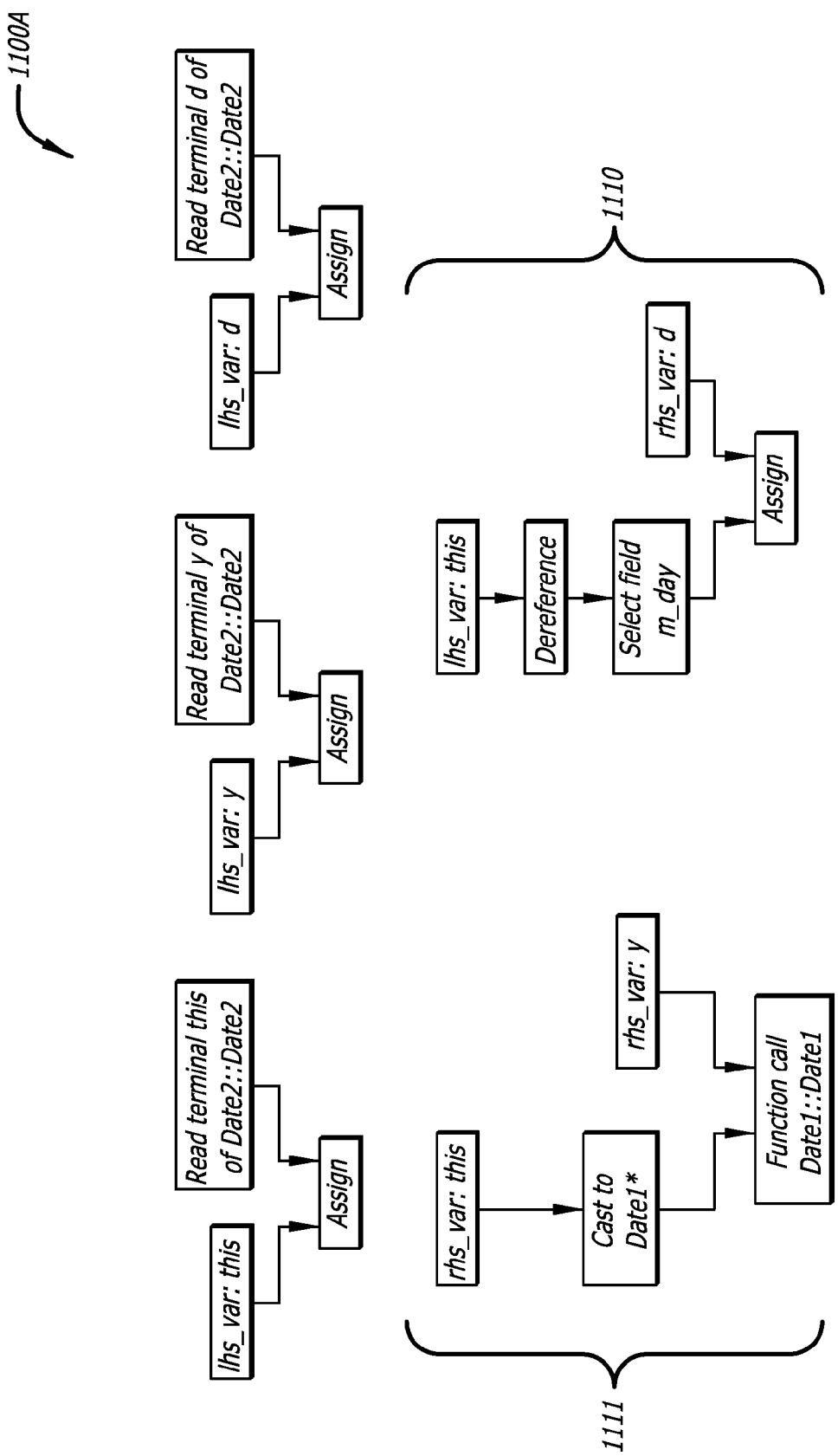
Figure 11B:
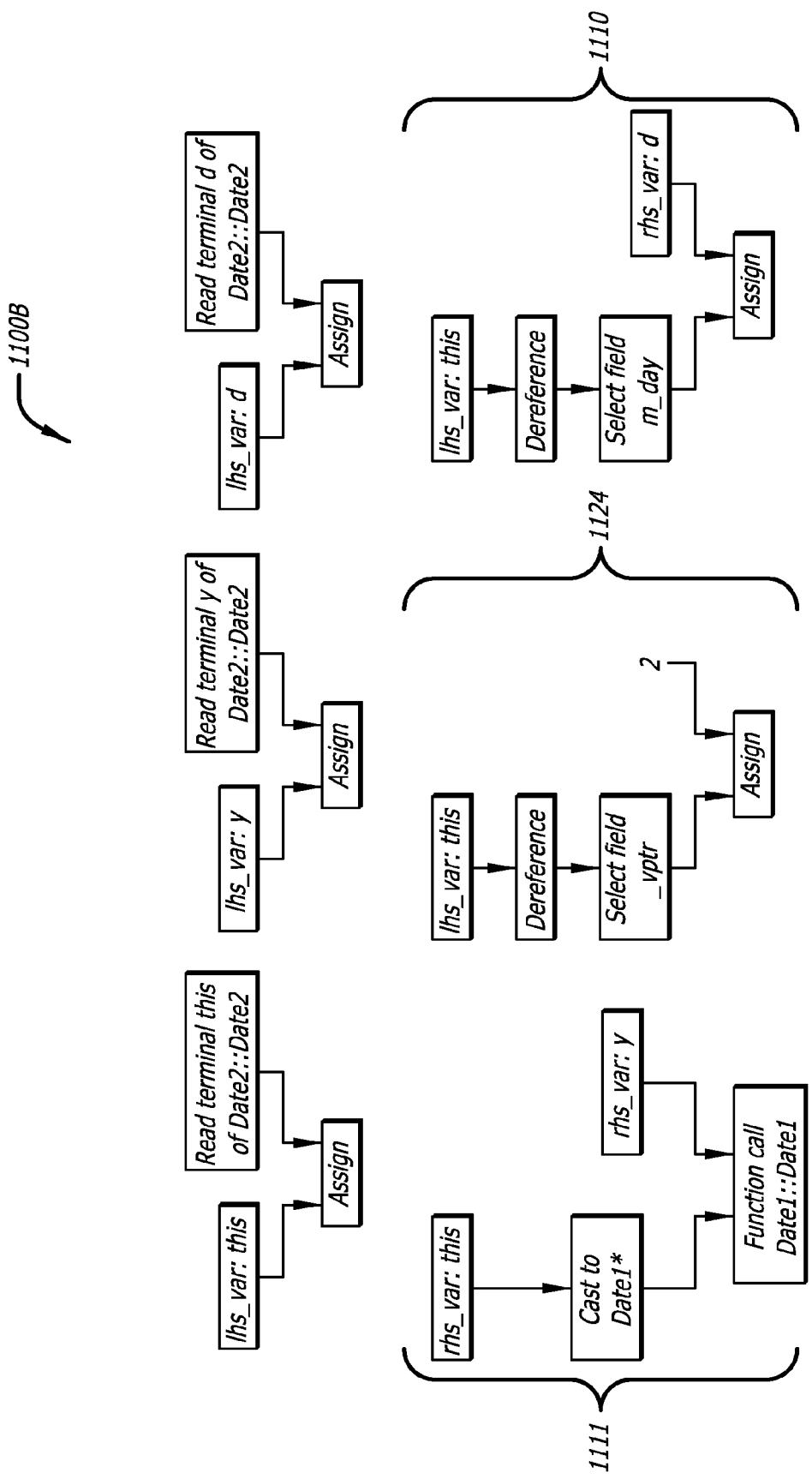
Figure 12A:
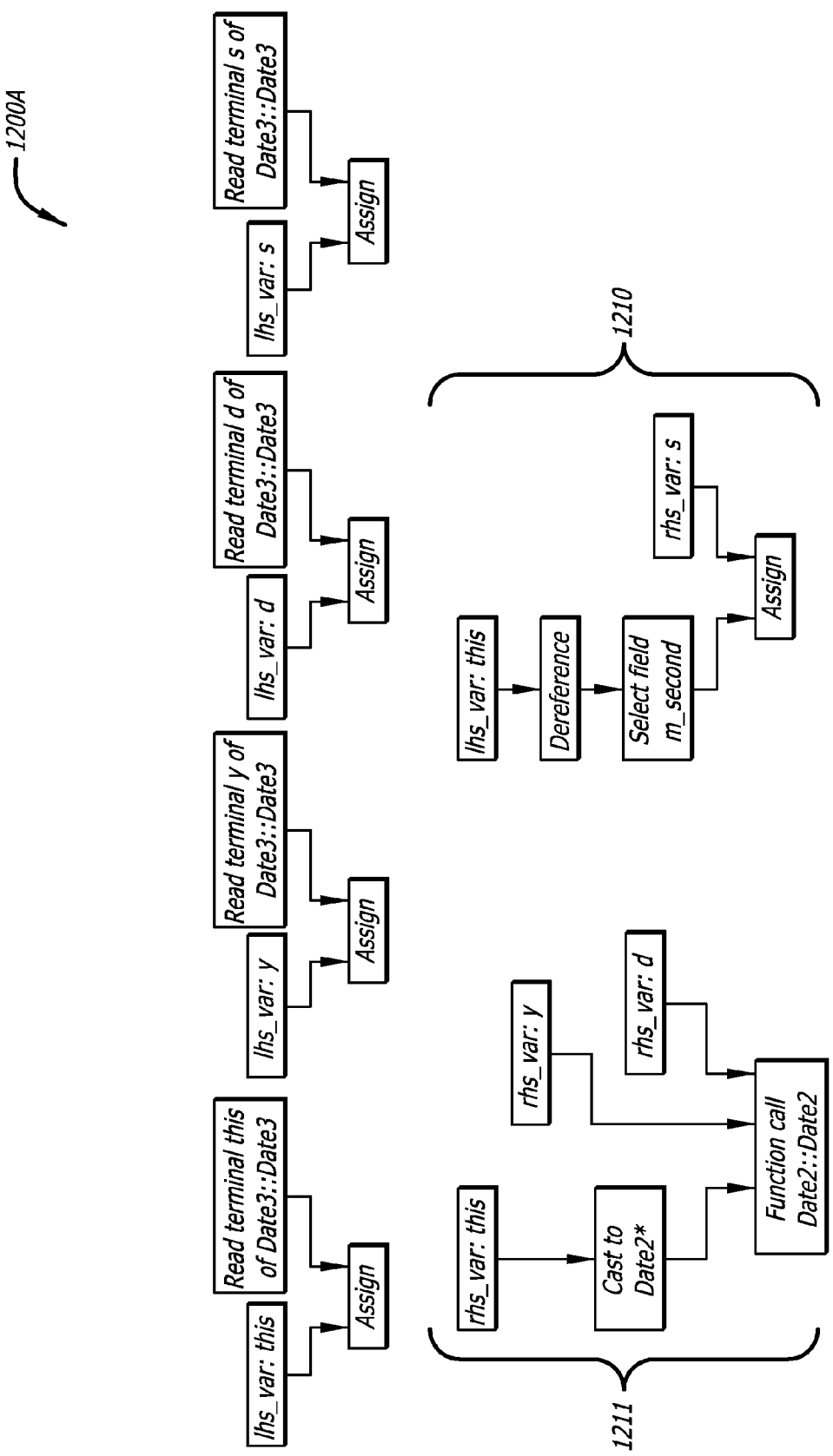
Figure 12B:
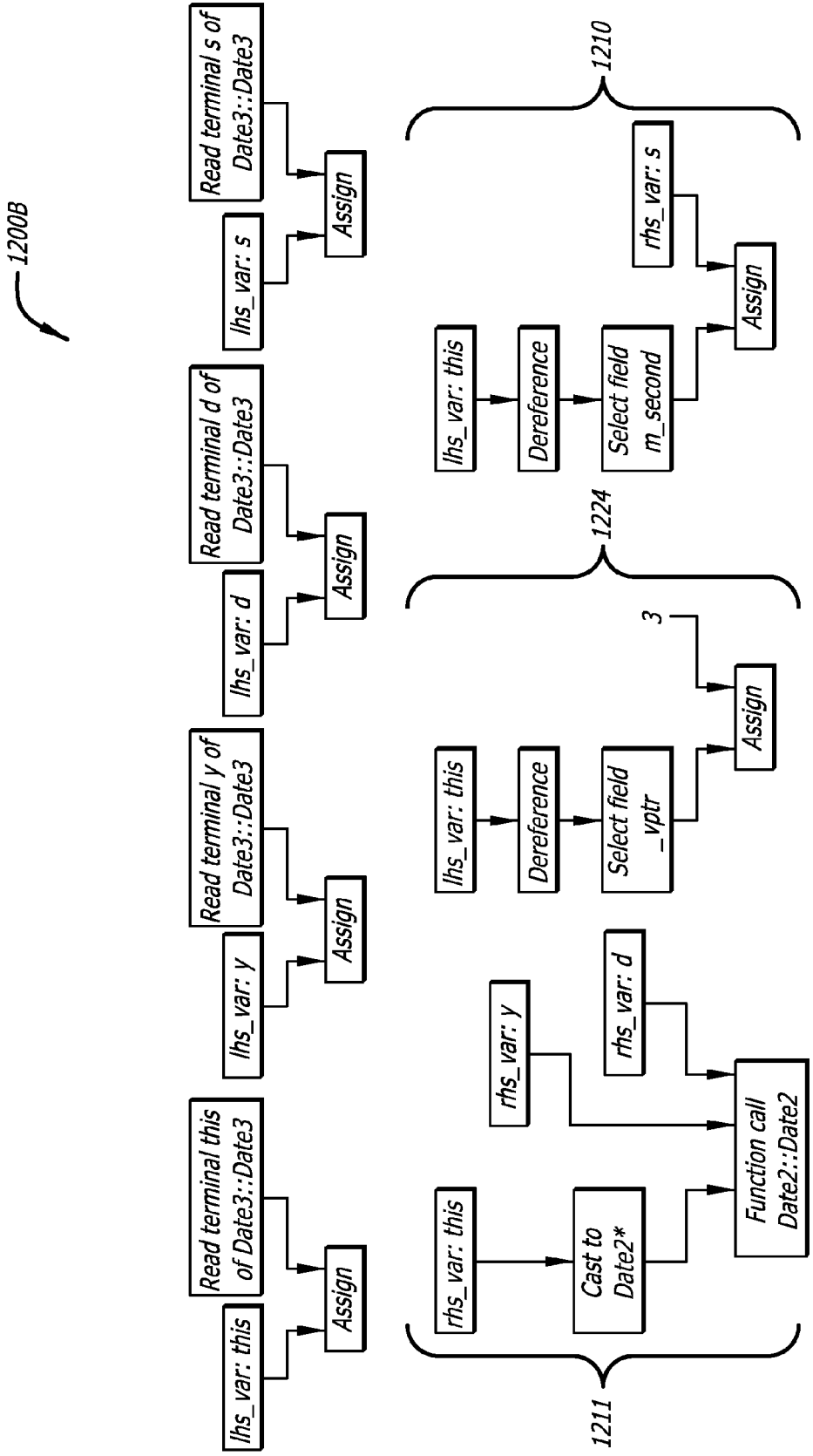

FIGS. 10A, 10B, 11A, 11B, 12A and 12B are data flow graphs 1000A, 1000B, 1100A, 1100B, 1200A, 1200B illustrating the constructors of class Date1, class Date2, and class Date3 respectively after converting the virtual functions and thus making these classes non-dynamic classes. FIGS. 10B, 11B, and 12B are data flow graphs 1000B, 1100B, 1200B respectively illustrating Date1, Date2, and Date3 dynamic classes with the process of the embodiment of the invention performed to add the virtual pointer fields 702A-702C shown in FIG. 7. With dynamic classes, the data flow graphs 1000B, 1100B,1200B includes data flow graph portions 1024,1124, 1224 for a virtual pointer field.

In FIG. 10A, with the Date1 class being a non-dynamic class, the data flow graph 1000A includes a data flow graph portion 1010 without any virtual pointer. In FIG. 10B, with the Date1 class being a dynamic class, the data flow graph 1000B includes a data flow graph portion 1024 corresponding to the virtual pointer field 702A as well as the data flow graph portion 1010.

In FIG. 11A, with the Date2 class being a non-dynamic class, the data flow graph 1100A includes a data flow graph portions 1110-1111 without any virtual pointer. In FIG. 11B, with the Date2 class being a dynamic class, the data flow graph 1100B includes a data flow graph portion 1124 corresponding to the virtual pointer field 702B as well as the data flow graph portions 1110-1111.

In FIG. 12A, with the Date3 class being a non-dynamic class, the data flow graph 1200A includes a data flow graph portions 1210-1211 without any virtual pointer. In FIG. 12B, with the Date3 class being a dynamic class, the data flow graph 1200B includes a data flow graph portion 1224 corresponding to the virtual pointer field 702C as well as the data flow graph portions 1210-1211.

With the structure graphs 222, the control flow graphs 224, and the data flow graphs 226 generated by the elaborator 210 stored in the internal design database 220, representing a lowered level of abstraction of the chip description, synthesizable RTL 105 and/or a behavior simulation model 240 may be generated for the integrated circuit design. The integrated circuit design may be synthesized with further processing of the synthesizable RTL 105.

Computer System for Use with High Level Synthesis Software

Referring now to FIG. 13, a computing system 1300 is illustrated that may be used to perform some or all of the processes in accordance with a number of embodiments of the invention. In one embodiment of the invention, the computing system 1300 includes a processor 1310, a memory 1320, a removable media drive 1330, and a hard disk drive 1340.

In one embodiment, the processor 1310 executes instructions residing on a machine-readable medium, such as the hard disk drive 1340, a removable medium 1301 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 1320, which may include Random Access Memory (RAM), dynamic RAM (DRAM), or other type of storage device or mechanism. The processor 1310 may retrieve the instructions from the memory 1320 and execute the instructions to perform the operations described herein.

Note that any or all of the components and the associated hardware illustrated in FIG. 13 may be used in various embodiments of the system 1300. However, it should be appreciated that other configurations of the system 1300 may include more or less devices than those shown in FIG. 13.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result.

The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

When implemented as an apparatus for performing the operations described herein, the apparatus may be specially constructed for the required purposes, or it may comprise a general-purpose computer selectively activated or reconfigured by a computer program stored in the computer. Such a computer program may be stored in a computer readable storage medium, any type of storage media or device suitable for storing electronic instructions, and each coupled to a computer system bus.

The processes presented herein are not inherently related to any particular computer or other apparatus. Various general-purpose systems may be used with programs in accordance with the teachings herein, or it may prove convenient to construct a more specialized apparatus to perform the operations described.

When implemented in software, the elements of the embodiments of the invention are essentially the program, code segments, or instructions to perform the tasks. The program, code segments, or instructions can be stored in a processor readable medium or storage device that can be read and executed by a processor or other type of computing machine. The processor readable medium may include any storage medium or storage device that can store information in a form readable by a processor or other type of computing machine. The program or code segments may be downloaded via computer networks such as the Internet, Intranet, etc and stored in the processor readable medium or storage device.

When implemented as a system, such as an electronic computer aided design (ECAD) system, the elements of the embodiments of the invention include one or more processors to execute the program, code segments, or instructions that may be stored in a processor readable medium or storage device to perform the tasks or functions of a method or process. The one or more processors may be specifically adapted to electronic computer aided design including processing logic that may comprise hardware (e.g., circuitry, dedicated logic, etc.), software, or a combination of both.

The embodiments of the invention are thus described. While embodiments of the invention have been particularly described, they should not be construed as limited by such embodiments. For example, while the embodiments of the invention have been described with reference to C++ programming language, it will be appreciated that a variety of programming languages may be used to implement the teachings of the invention as described herein. The embodiments of the invention should be construed according to the claims that follow below.

What is claimed is:

1. A method for integrated circuit design, the method comprising:
    determining if at least one dynamic class and at least one virtual function are present within a chip program description of an integrated circuit design; and
    if at least one dynamic class and at least one virtual function are present within the chip program description then
        converting the at least one virtual function into a non-virtual function,
        generating at least one virtual pointer field for the at least one dynamic class,
        converting at least one virtual function call into at least one conditional function responsive to a value of the at least one virtual pointer field, and
        generating dataflow graphs of the at least one dynamic class and the at least one conditional function, wherein the dataflow graphs are transformable into a synthesizable design description of the integrated circuit design;
    wherein one or more of the determining, converting, and generating are performed by a processor.

2. The method of claim 1, wherein
the at least one virtual function is identified by the word virtual in a line of the chip program description.

3. The method of claim 1, where if at least one dynamic class and at least one virtual function are present within the chip program description then the method further comprises:
    generating a synthesizable design description of the integrated circuit design using a high-level description language.

4. The method of claim 1, wherein
the determining includes
    parsing the chip program description of the integrated circuit design into a parse tree, and
    identifying the dynamic classes and the virtual functions within the parse tree.

5. The method of claim 1, where if at least one dynamic class and at least one virtual function are present within the chip program description then the method further comprises:
    prior to converting and generating, discovering base class relationships in the at least one dynamic class and the at least one virtual pointer.

6. The method of claim 5, wherein
the discovering of the base class relationships includes discovering classes that are derived from dynamic base classes and discovering pointers utilized in the at least one virtual function that point to a virtual function call in a virtual table.

7. The method of claim 5, wherein a plurality of dynamic classes are present within the chip program description and the method further comprises:
    prior to converting and generating,
        partitioning the plurality of dynamic classes into partitioned classes, each partitioned class having like classes with common base types, and
        assigning a unique identifier to each partitioned class.

8. The method of claim 7, wherein
the data flow graphs are generated for each partitioned class.

9. The method of claim 1, wherein
the at least one conditional function responsive to a value of the at least one virtual pointer includes a plurality of conditional calls responsive to the value of the at least one virtual pointer, and the method further comprises
    selecting one of the conditional calls to provide a return value for the at least one conditional function in response to the value of the at least one virtual pointer.

10. A machine-readable product comprising:
    a machine readable medium having stored therein
        instructions to determine if at least one dynamic class and at least one virtual function are present within a chip program description of an integrated circuit design;
        instructions to convert the at least one virtual function into a non-virtual function if at least one dynamic class and at least one virtual function are present within the chip program description;
        instructions to generate at least one virtual pointer for the at least one dynamic class if at least one dynamic class and at least one virtual function are present within the chip program description;
        instructions to convert at least one function calling the at least one virtual function into at least one conditional function responsive to a value of the at least one virtual pointer if at least one dynamic class and at least one virtual function are present within the chip program description; and
        instructions to generate dataflow graphs of the at least one dynamic class and the at least one conditional function if at least one dynamic class and at least one virtual function are present within the chip program description, wherein the dataflow graphs are transformable into a synthesizable design description of the integrated circuit design.

11. The machine-readable product of claim 10, wherein
the machine readable medium has further stored therein
    instructions to generate a synthesizable design description of the integrated circuit design using a high-level description language in response to the dataflow graphs if at least one dynamic class and at least one virtual function are present within the chip program description.

12. A high level synthesis system to translate a SystemC chip description into a synthesizable format, the high level synthesis system comprising:

instructions stored in a storage device executable by a processor, the instructions when executed by a processor provide:

a parser to receive a SystemC chip description of an integrated circuit design and generate a parse tree, the SystemC chip description including at least one virtual function and at least one dynamic class;

an elaborator in communication with the parser to receive the parse tree, the elaborator to generate data flow graphs without the at least one virtual function, wherein the data flow graphs are for forming a synthesizable register transfer level description of the integrated circuit design; and an internal design database in communication with the elaborator to receive the data flow graphs, the internal design database to store the data flow graphs for subsequent formation of the synthesizable register transfer level description of the integrated circuit design.

13. The high level synthesis system of claim 12, wherein the parse tree identifies constructors and relationships between functions in the SystemC chip description of the integrated circuit design.

14. The high level synthesis system of claim 13, wherein the elaborator processes the constructors and relationships between functions in the SystemC chip description identified by the parse tree into the data flow graphs.

15. The high level synthesis system of claim 12, wherein the data flow graphs include components and functions that are for forming the synthesizable register transfer level description of the integrated circuit design.

16. The high level synthesis system of claim 12, wherein the internal design database further stores structure graphs and control flow graphs generated by the elaborator in response to the SystemC chip description of the integrated circuit design.

17. The high level synthesis system of claim 16, wherein the structure graphs, the control flow graphs, and the data flow graphs are generated in further response to constraints of the integrated circuit design and a technology cell library.

18. The high level synthesis system of claim 16, wherein the instructions stored in the storage device executable by the processor further provide:

a model generator in communication with the internal design database to receive the structure graphs, the control flow graphs, and the data flow graphs, the model generator to form the synthesizable register transfer level description of the integrated circuit design in response to the structure graphs, the control flow graphs, and the data flow graphs.

19. The high level synthesis system of claim 12, wherein the model generator further forms a behavioral simulation model of the integrated circuit design in response to the structure graphs, the control flow graphs, and the data flow graphs.

20. A system for integrated circuit design, the system comprising:

a processor to execute instructions; and a storage device coupled to the processor, the storage device to store instructions executable by the processor including instructions to determine if at least one dynamic class and at least one virtual function are present within a chip program description of an integrated circuit design;

instructions to convert the at least one virtual function into a non-virtual function if at least one dynamic class and at least one virtual function are present within the chip program description;

instructions to generate at least one virtual pointer for the at least one dynamic class if at least one dynamic class and at least one virtual function are present within the chip program description;

instructions to convert at least one function calling the at least one virtual function into at least one conditional function responsive to a value of the at least one virtual pointer if at least one dynamic class and at least one virtual function are present within the chip program description; and instructions to generate dataflow graphs of the at least one dynamic class and the at least one conditional function if at least one dynamic class and at least one virtual function are present within the chip program description, wherein the dataflow graphs are transformable into a synthesizable design description of the integrated circuit design.

21. The system of claim 20, wherein the storage device stores further instructions executable by the processor including instructions to generate a synthesizable design description of the integrated circuit design using a high-level description language in response to the dataflow graphs if at least one dynamic class and at least one virtual function are present within the chip program description.

* * * * *